(12) United States Patent
Tzuang

(10) Patent No.: US 9,997,478 B1
(45) Date of Patent: Jun. 12, 2018

(54) CIRCUITS AND ANTENNAS INTEGRATED IN DIES AND CORRESPONDING METHOD

(71) Applicant: Ching-Kuang C. Tzuang, Hsinchu County (TW)

(72) Inventor: Ching-Kuang C. Tzuang, Hsinchu County (TW)

(*) Notice: Subject to any disclaimer, the term of this patent is extended or adjusted under 35 U.S.C. 154(b) by 0 days. days.

(21) Appl. No.: 15/481,910

(22) Filed: Apr. 7, 2017

(51) Int. Cl.
| | |
|---|---|
| *H01L 27/14* | (2006.01) |
| *H01L 23/66* | (2006.01) |
| *H01Q 1/48* | (2006.01) |
| *H01Q 1/22* | (2006.01) |
| *H01Q 21/06* | (2006.01) |
| *H01Q 21/00* | (2006.01) |

(52) U.S. Cl.
CPC .......... *H01L 23/66* (2013.01); *H01Q 1/2283* (2013.01); *H01Q 1/48* (2013.01); *H01Q 21/0087* (2013.01); *H01Q 21/06* (2013.01); *H01L 2223/6616* (2013.01); *H01L 2223/6677* (2013.01)

(58) Field of Classification Search
CPC ............. H01L 23/66; H01L 2223/6616; H01L 2223/6677; H01Q 1/2283; H01Q 1/48; H01Q 21/0087; H01Q 21/06
USPC .......................................................... 257/428
See application file for complete search history.

(56) References Cited

U.S. PATENT DOCUMENTS

| | | | | |
|---|---|---|---|---|
| 8,570,223 | B2 * | 10/2013 | Arslan | ..................... H01Q 1/38 343/700 MS |
| 2011/0036912 | A1 * | 2/2011 | Guo | ................. G06K 19/07749 235/492 |

* cited by examiner

*Primary Examiner* — Tu-Tu Ho
(74) *Attorney, Agent, or Firm* — WPAT, PC

(57) ABSTRACT

Circuits and antennas integrated in dies and corresponding method. The circuits and the antennas are positioned on the front surface and the back surface of the substrate respectively, but both are electrically coupled to the shared ground of the substrate. To maintain the mechanical strength of the die, some dummy metals are positioned on the back surface of the substrate and positioned around but separated away the antennas. Further, to reduce the potential side effects induced by the induced current, some ground balls are positioned on one or surfaces of the substrate.

28 Claims, 7 Drawing Sheets

CIRCUITS AND ANTENNAS INTEGRATED IN DIES AND CORRESPONDING METHOD

FIELD OF THE INVENTION

The present invention relates to the die with both circuits and antenna and the integration method that the circuits and the antenna are positioned respectively on the front surface and the back surface of the substrate but shares that shared ground, especially the die with both circuits and antenna and the integration method that utilizes the dummy metals positioned on the back surface and electrically insulated away the antenna to maintain the mechanical strength.

BACKGROUND OF THE INVENTION

The development of the semiconductor industry during the past years generally tends to position the circuits utilized to process and store signals (such as active circuits, passive circuits and memory) and the antenna utilized to transmit and/or receive the electromagnetic wave in different integrated circuits. Although the dies having the circuits and the dies having the antenna may be positioned on the same printed circuit board (PCB), also although the dies having the circuits may be positioned one side of the PCB and the antenna (or viewed as the die having the antenna) may be positioned on another side of the PCB.

Nevertheless, there is always a requirement to integrate the antenna and the circuits into the same die, because it may reduce the number of the required dies, reduce the required PCB area and reduce the required transmissions of numerous electromagnetic signals between different dies. But, till now, the integration of the circuits and the antenna into the same die meet at least the following technology problems: 1) The area of the antenna is obviously larger than the area of the circuits for most of electromagnetic wave applied by the current commercial applications, and then their distributions on the die are hardly to match mutually. 2) The interference between the antenna and the circuits, especially the two terminals of the antenna will strongly interfere the circuits positioned close to if the electromagnetic wave being transmitted and/or received. 3) The larger occupied area and the obvious interference if both the circuits and the antenna being positioned on the same surface of the die. 4) The signal transmission between the antenna and the circuits, the mechanical strength of the die and the ground of both the circuits and the antenna are all un-solved problems if the circuits and the antenna are positioned on the opposite surfaces of the die.

Therefore, it is desired to provide the die with the integration of the circuits and the antenna and the integration method, especially as the electromagnetic wave frequency of the commercial applications had been gradually developed to the range that the antenna size is equivalent to the circuits size.

SUMMARY OF THE INVENTION

The invention positions the antenna and the circuits on different surfaces of the substrate and electrically connects both to the shared ground, further optionally positions some dummy metals on the surface where the antenna is positioned and separates these dummy metals away the antenna so as to maintain the mechanical strength of the die and meet the requirement of the fabrication process. Moreover, one or more ground balls may be utilized to connect the die and the PCB (or viewed as to connect the die and the external environment) so as to reduce the effect and the induced current, also numerous silicon vias may be positioned inside the substrate of the die to electrically connect the circuits and the antenna.

In general, the shared ground is positioned inside the substrate and between the front surface and the back surface, but the invention does not to limit the details of the shard ground. In other words, it is not necessary to restrict and/or change the details of the circuits and/or the antenna to meet the details of the shared ground, also is not necessary to limit and/or change the distribution of the circuits and/or the antenna on the back surface and/or the front surface to meet the details of the shared ground.

In general, the circuits are positioned on the front surface of the substrate and the antenna is positioned on the hack surface of the substrate, but the invention needs not limit the details of the distribution of the antenna on the substrate. In other words, the antenna may be positioned in the center of the back surface of the substrate or on the edge of the back surface of the substrate, also the antenna may be overlapped or separated away the circuits positioned on the front surface of the substrate along a direction vertical to the two surfaces.

In general, the distribution of the dummy metals only have to be separated from the antenna, and the invention may flexibly adjust the details of the distribution of the dummy metals on the back surface of the substrate, no matter the number, the shape, the area, the distance therebetween or the relative relation between the dummy metals and the antenna. The distribution of the dummy metals on the substrate distribution is dependent on the geometrical contour of antenna, the frequency of the electromagnetic wave the antenna is designed to transmit and/or receive, the mechanical strength of the die and the corresponding fabrication process.

In general, the usage of the ground balls is conducting the induced circuit induced by the electromagnetic wave transmitted and/or received by the antenna to the printed circuit board. The ground balls may be uniformly distributed around the antenna on the back surface of the substrate, or may be distributed on one or more surfaces of the substrate, or may be concentrated on where the strength and/or amount of the induced current is higher, i.e., the invention does not limit the details of the number and the distribution of the ground balls.

In general, the method of integrating the antenna and the circuits to the same integrated circuits includes the following steps. Initially, set a distribution of the antenna and the dummy metals on the substrate back surface and the distribution of the ground balls on one or more surfaces of the substrate. Next, simulate the distribution of the electromagnetic field and the current, and then adjust the distribution of the antenna, the dummy metals and the ground balls. After that, repeatedly simulate and adjust until an acceptable distribution of the antenna, the dummy metals and ground balls are found. As usually, the shape of the position of the antenna is fixed, and the invention usually focuses on the adjustment of the distribution of the dummy metals and the ground balls. Moreover, the invention usually only repeatedly adjusts the distribution of the dummy metals until an acceptable distribution is found with a special distribution of the ground balls, because the connection between the ground balls and the printed circuit board has to consider several factors but not mainly dependent on the distribution of the ground balls on the back surface of the substrate.

DETAILED DESCRIPTION OF THE INVENTION

Figure 1A:
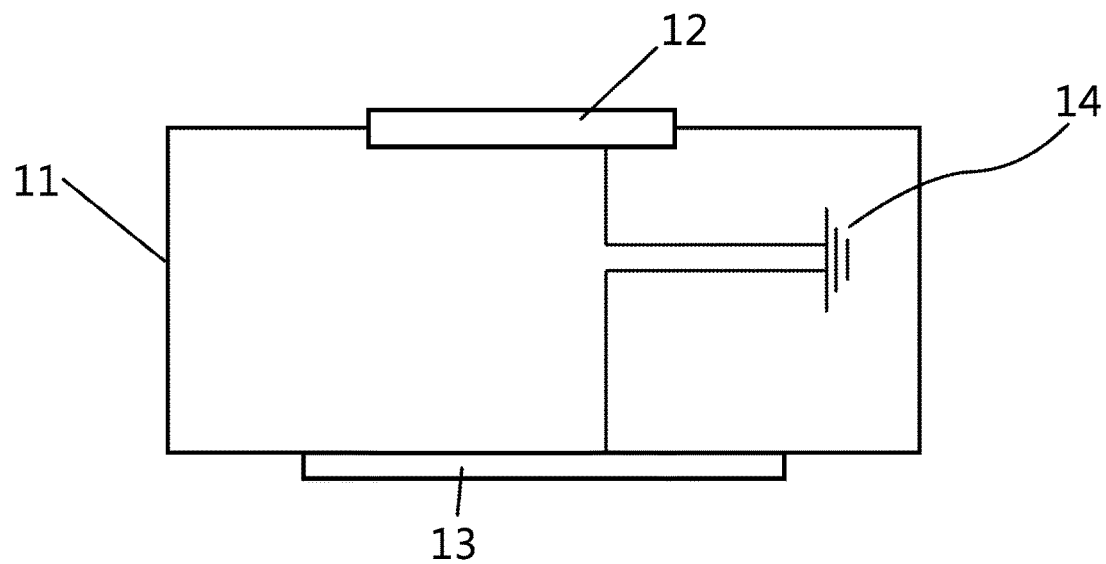
FIG. 1A and FIG. 1B briefly and respectively illustrates the essential configuration and an exemplary configuration of the die with both circuits and antenna proposed by the invention.

Reference will now be made in details to specific embodiment of the present invention. Examples of these embodiments are illustrated in the accompanying drawings. While the invention will be described in conjunction with these specific embodiments, it will be understood that the intent is not to limit the invention to these embodiments. In fact, it is intended to cover alternates, modifications, and equivalents as may be included within the spirit and scope of the invention as defined by the appended claims. In the following description, numerous specific details are set forth in order to provide a thorough understanding of the present invention. The present invention may be practiced without at least one of these specific details. In other instances, the well-known portions are less or not described in detail in order not to obscure the present invention.

In general, the length of the edge of the die is about several millimeters, otherwise, the signal transmission and the heat dissipation of the circuits inside the die for processing and storing signals will obviously degrade the performance. But, the wavelength of the practically utilized electromagnetic wave practically utilized during the past years usually is larger than several millimeters, especially the wavelength of the electromagnetic wave that the corresponding antenna may be integrated into the die usually is obviously larger than several millimeters. Hence, in the situation that the circuits utilized to process and store signals and the antenna utilized to receive and transmit electromagnetic wave are integrated into the same die, essentially only the package technology is utilized to integrate the die with circuits and the die with circuits. In this way, not only the number of the utilized dies and the die areas are not saved, but also have to handle the signal transmission and the mutual interference between the circuits and the die.

However, for example, the Terahertz-fig ahertz (THz) wave with the frequency range from tens GHz to several THz has been gradually utilized to some practical applications, such as security checking tool, communication, material analysis and so no. Hence, the size of the antenna utilized to receive or transmit the electromagnetic wave is gradually briefly equal to or even smaller than the size of the circuits utilized to process and store the electromagnetic signals. That is to say, if the signal transmission between the circuits and the antenna, the mutual interference between the circuits and the antenna and the mechanical strength of the die having both the antenna and the circuits, even other requirements, may be properly treated, it is possible to position the antenna and the circuits respectively on two opposite surfaces of a die so as to reduce the number of the utilized die and the reduce the area of the utilized die.

In response to the trend, the invention proposes the die having the antenna and the circuits and the corresponding method of integration, and also provides the following exemplary embodiments and related descriptions for describing the invention.

FIG. 1A briefly illustrates the essential configuration of the die with both the circuits and the antenna proposed by the invention. The circuit 12 is positioned on the front surface of the substrate 11 and the antenna 13 is positioned on the back surface of the substrate 11, and both the circuits 12 and the antenna are electrically connected to the shared ground 14. Significantly, because the circuits 12 and the antenna 13 are formed on two opposite surfaces of the same substrate 13, the material and the thickness of the substrate 11 may be utilized to reduce the mutual interference between the circuits 12 and the antenna 13, especially the mutual interference between the antenna 13 and the coupler inside the circuits 12. Particularly, the circuits 12 and the antenna 13 may be overlapped along a direction vertical to both the front surface and the back surface so as to reduce the area of the chip with antenna and circuits, especially if the wavelength of the electromagnetic wave to be received and/or transmitted by the antenna 13 and the size of the circuits 12 is at the same size or at the difference between the top several times. Besides, because the circuits 12 and the antenna 13 have the same electrical ground, the operations of them have the common standard. Then, both the process of transforming the electromagnetic wave received by the antenna into the electromagnetic signal and then transmitting the electromagnetic signal to the circuits and the process of transmitting the electromagnetic signal generated by the circuits 12 and then transmitting the electromagnetic signal to the antenna 13 for transmitting the corresponding electromagnetic wave may be operated properly.

Figure 1B:
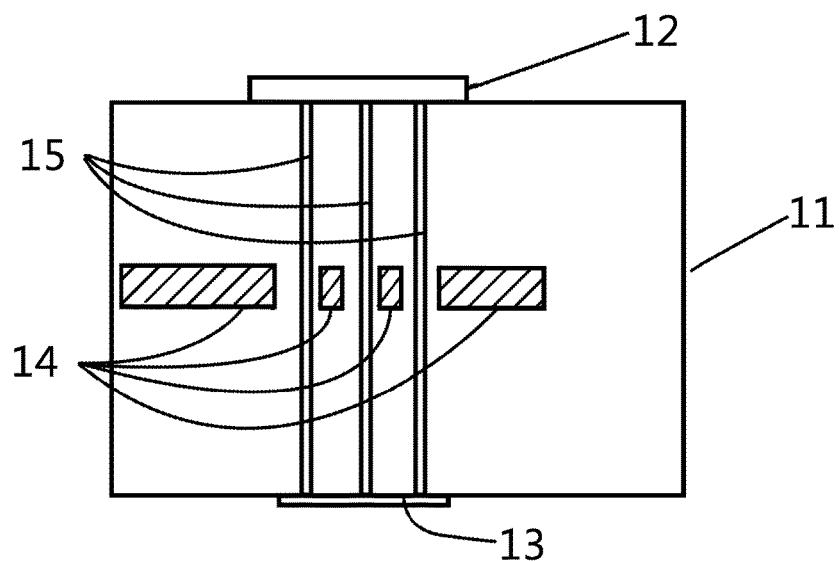

FIG. 1B briefly illustrates one exemplary configuration of the die with both the circuits and the antenna proposed by the invention. The circuits 12 and the antenna 13 are positioned on two opposite surfaces of the substrate 11, at least one through silicon via (TSN) electrically connects the circuits 12 and the antenna 13, and the shared ground 14 is positioned inside the substrate 11 and separated away the TSN 15.

It should be emphasized that the invention does not need to limit the details of the circuits 12, the antenna 13 and the shared ground 14. For example, on different embodiments, the shared ground 14 may be positioned inside the substrate 11 and between the antenna 13 and the circuits 12, or may be positioned on the side surface of the substrate 11, or may be positioned on the front surface of the substrate 11 and separated from the circuits 12, also may be positioned on the back surface of the substrate 11 and separated from the antenna 13. For example, it is optional to view the invention as integrating the antenna 13 to the substrate 11 has the circuit 12, and then the ground utilized by the circuits no matter whether the antenna is existed or not may be utilized as the shared ground 14. For example, the circuit 12 may be formed by utilizing the complementary-conducting-strip structure (CCS structure), and the shared ground may be the ground utilized by the CCS structure.

The invention also does not need to limit other details of the die with the circuits and the die. For example, the material of the substrate 11 may be silicon or Gallium Arsenide or other materials may be utilized in the semiconductor industry. For examples, one or more dielectric layers may be positioned on one or more surfaces of the substrate 11 (no matter the front surface, the back surface and/or the side surface) for electrically insulating the circuits 12 and the antenna 13 or electrically insulating the shared ground 14 and both the circuits 12 and the antenna 13. In addition, the dielectric layer may be made of any dielectric material utilized in the semiconductor industry.

Furthermore, the invention only limits that the circuits 12 and the antenna 13 are positioned on two opposite surfaces, even two different surfaces, of the substrate 11, but does not need to limit the relative relation between the substrate 11 and both the antenna 12 and the circuits 13. For example, the position of the antenna 13 on the back surface may be flexibly adjusted to be positioned in the center of the back surface, or on the edge of the back surface, or overlapped with the circuits 12 along the direction vertical to the front surface and the back surface, or separated from the circuits 12 along the direction vertical to the front surface and the back surface. For example, the size of the antenna 12 is proportional to the wavelength of the electromagnetic wave that the antenna is designed to receive and/or transmit. For example, the area ratio between the antenna 13 and the back surface is flexibly adjustable. As usual, the ratio is as large as possible if the antenna 13 is the resonant antenna, but the ratio is not limited if the antenna is not the resonant antenna.

To ensure the antenna may properly receive and/or transmit the electromagnetic wave, it is better that no any material/structure capable of affect the transmission of the electromagnetic wave or interacting with the antenna 13 is positioned close to the antenna 13. In other words, in some embodiments, there is only the antenna 13 on the back surface of the substrate 11, at least some elements utilized to connect the substrate 11 with both the circuits 12 and the antenna 13 to the printed circuit board.

However, limited by the mechanical strength of the die and/or the requirements of fabrication process required by the foundry, even the packaging plant, if only the antenna 13 is positioned on the back surface of the substrate 11, sometimes the final product with the die having circuits and antenna may be damaged due to the insufficient mechanical strength, or sometimes the substrate 11 or the antenna 13 may be damaged during the fabrication process and then the die with both circuits and antenna can not properly formed. Although increasing the area ratio between the antenna 13 and the back surface may increase the mechanical strength of the die or meet the requirements of the foundry, even the packaging plant, the size of the antenna 13 is related to the electromagnetic wave to be received and/or transmit by the antenna 13, if overly increase the area of the antenna 13 (such as the width of the antenna 13) also may induce some other disadvantages such as the leakage current.

Figure 2A:
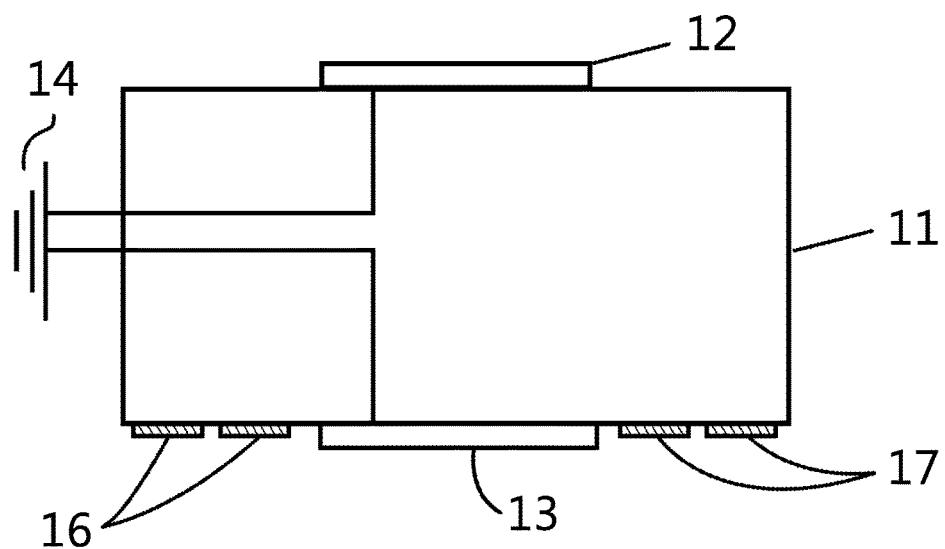
FIG. 2A to FIG. 2B briefly and respectively illustrates two exemplary configurations of the die with both circuits and antenna and using the dummy metals.
Figure 2B:
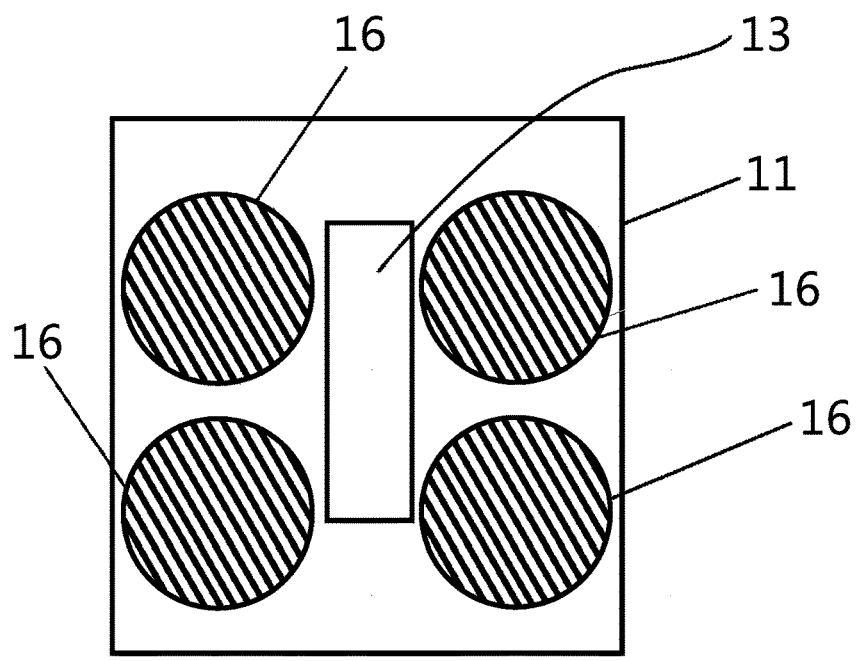

Therefore, some embodiments of the proposed invention may position some dummy metals on the back surface of the substrate 11 so as to co-work with the antenna 13 for providing the required mechanical strength or for meeting the fabrication requirements collectively. Hence, the details of the antenna 13 (such as shape and size) may be optimized according to the electromagnetic wave to be transmitted and/or received, and the required mechanical strength and fabrication requirement may be met by adjusting the details of the dummy metal (such as shape and size). Of course, to minimize the possible negative effects on the antenna 13, these dummy metals are separated from the antenna 13. Further, to meet the required mechanical strength and fabrication requirement, these dummy metals usually surrounds the antenna 13, except the antenna 13 is positioned on the edge of the back surface so that the dummy metals only may be positioned on other portions of the back surface. Besides, each dummy metal 13 may be electrically separated from the shared ground and is not electrically from too. In other words, the electric insulation between any dummy metal and the shared ground is not limited. Two exemplary configurations of the die with both circuits and antenna and using the dummy metals 16 are briefly and respectively illustrated in FIG. 2A and FIG. 2B.

Significantly, the usage of the dummy metal 16 is based on the required die mechanical strength and/or the required die fabrication process, hence, both the area ratio between the antenna 13 and the dummy metals 16 and the distribution of the dummy metals 16 on the back surface are dependent on at least the die mechanical strength and the die fabrication process. In other words, the invention may flexibly adjust the area ratio between the antenna 13 and the dummy metals 16 and the distributions of both the antenna 13 and the dummy metals 16 on the back surface according to the practical specifications of the die and the fabrication parameters/limitations provided by the foundry.

Figure 2C:
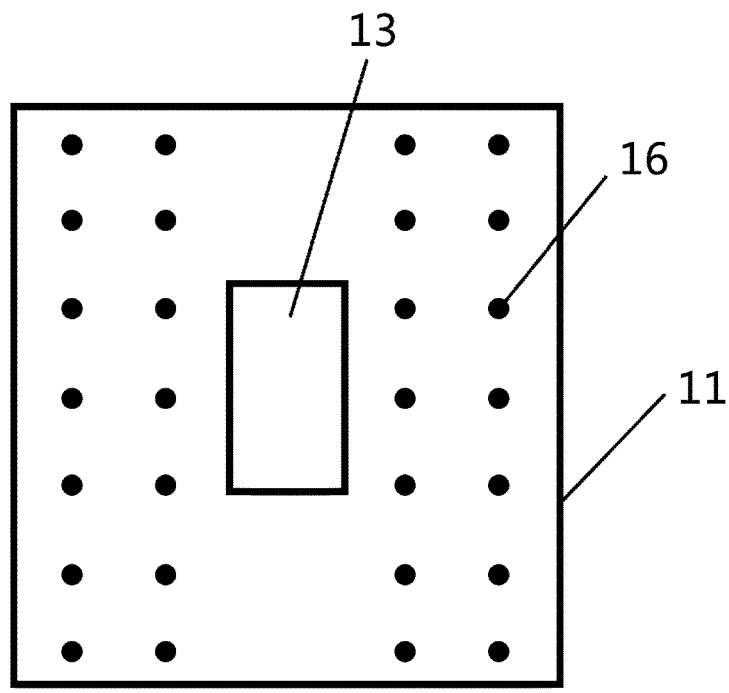
FIG. 2C to FIG. 2E briefly and respectively illustrates three exemplary configurations of the die with both circuits and antenna and using the dummy metals.
Figure 2D:
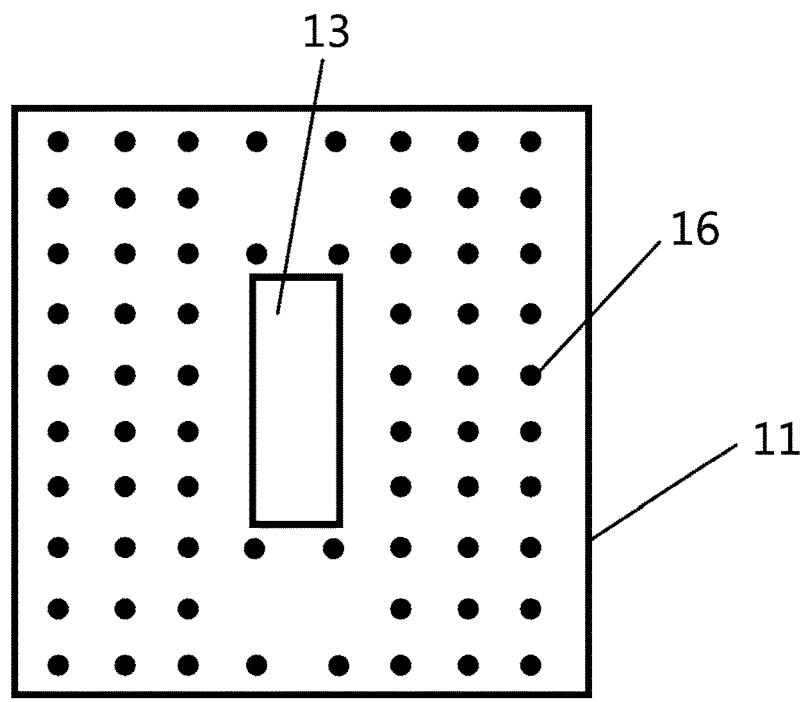
Figure 2E:
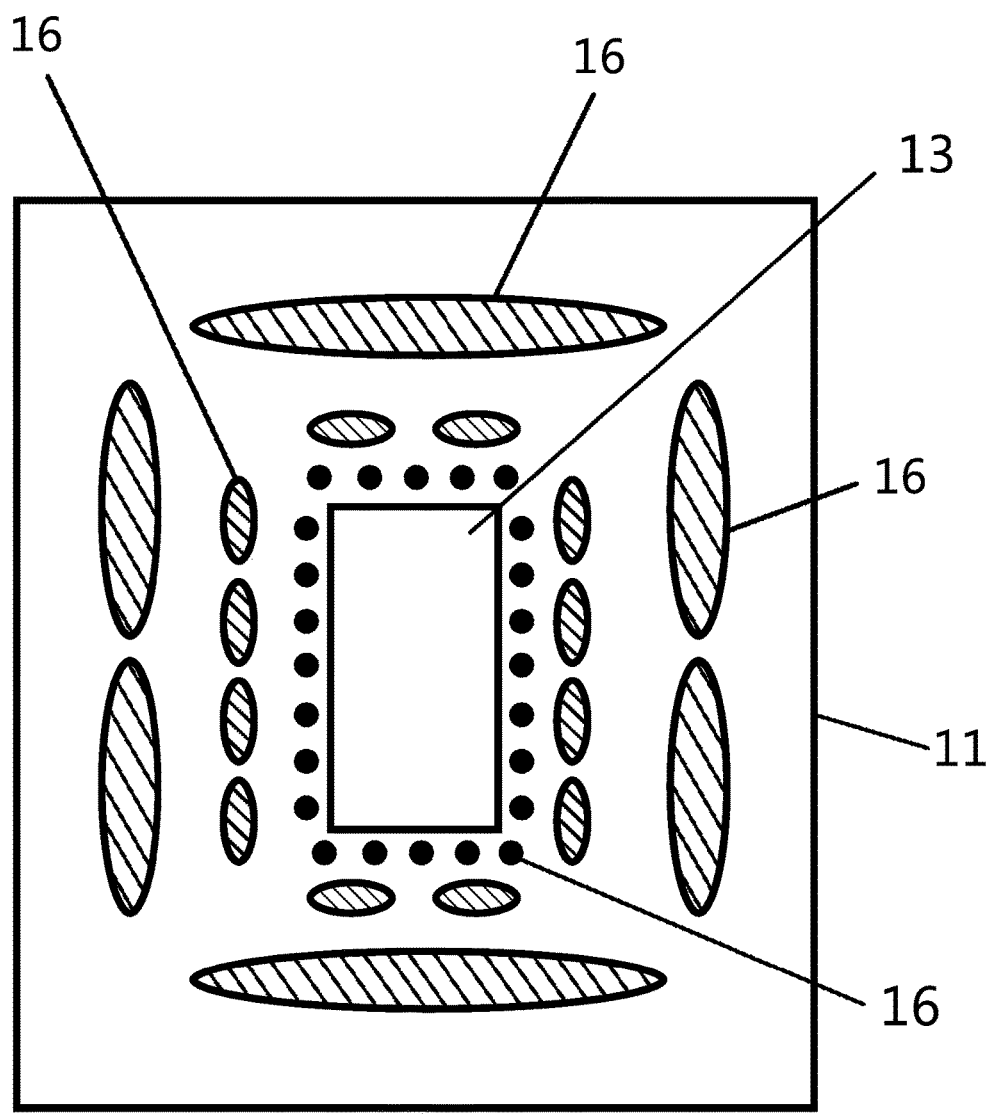

Nevertheless, to reduce the mutual interference between the dummy metals 16 and the antenna 13, especially to reduce the mutual interference between the antenna 13 and some of the dummy metals 16 positioned close to two terminals of the longitudinal direction of the antenna 13 wherein the energy of the electromagnetic wave is higher during the period of transmitting and/or receiving the electromagnetic wave, there are still some limitations on the distribution of the dummy metals 16 on the back surface of the substrate 11. For example, in some embodiments, these dummy metals 16 are more far away to the antenna 13 around the two terminals of the antenna 13 where the electromagnetic wave is transmitted and/or received but is closer to the antenna 13 around other portions of the antenna 13. For example, in some embodiments, the density of these dummy metals 16 is lower around the two terminals of the antenna 13 where the electromagnetic wave is transmitted and/or received but is higher close to other portions of the antenna 13. For example, the size of each dummy metal 16 is smaller around the two terminals of the antenna 13 where the electromagnetic wave is transmitted and/or received but is larger close to other portions of the antenna 13. Of course, on some other embodiments, the limitations may be that the density of partial dummy metals 16 is lower if they are far away the antenna 13 and the density of another partial dummy metals 16 is higher if they are close to the antenna 13, and also may be that the size of partial dummy metals 16 is smaller if they are far away the antenna 13 and the size of another partial dummy metals 16 is larger if they are close to the antenna 13. Besides, the shape of the dummy metals 16 may be different on different embodiments, even different dummy metals 16 may have different on the same embodiment. The invention may flexibly adjust the dummy metals 16. For example, to simply the fabrication process and the mechanical structure, the shape of any dummy metal 16 may be quadrilateral or rectangle. Three exemplary configurations of the die with both circuits and antenna and using the dummy metals are briefly and respectively illustrated in FIG. 2C to FIG. 2E.

Furthermore, both the distance between these dummy metals 16 and the antenna 13 and the distance between these dummy metals 16 and the two terminals of the antenna 13 where the electromagnetic wave is transmitted and/or received usually are proportional to the wavelength of the electromagnetic wave the antenna 13 is designed to transmit and/or receive, because the range with higher electromagnetic wave attitude around the two terminals of the antenna 13 usually is proportional to the wavelength of the electromagnetic wave the antenna 13 is designed to transmit and/or receive. Besides, the distance between neighboring dummy metals 16 (or viewed as the gap of the dummy metals 16 usually is proportional to the wavelength of the electromagnetic wave the antenna is designed to transmit and/or receive so as to reduce the side effects such as the diffraction of the electromagnetic wave or others.

Furthermore, to utilize the dummy metals 16 to enhance mechanical strength and meet fabrication requirement, also to reduce the effect of induced current generated during the period of transmitting and/or receiving the electromagnetic wave by the antenna 13, some embodiments minimize the area of each of the dummy metals 16. In other words, it is better to utilize a lot of dummy metals 16 where each has smaller area but not utilize a bit of dummy metals 16 where each has larger area, if the total area of the dummy metals 16 is fixed. Besides, the distance (or viewed as spacing) between the dummy metals 16 and the antenna 13 even that between the neighboring dummy metals 16 are all adjustable, although the distance is a minor factor for enhancing the mechanical strength and meeting fabrication requirement. In some embodiments, the distance between the dummy metals 16 and the antenna 13 is as smaller as possible if the distance is not smaller than the wavelength of the electromagnetic wave to be processed by the antenna 13. In some embodiments, the distance between the dummy metals 16 and the antenna 13 is as small as possible without any limitation.

For example, if the antenna is designed to transmit and/or receive the electromagnetic wave with the frequency range between 80 GHz to 650 GHz, the distribution of these dummy metals 16 on the back surface of the substrate 11 is limited by at least one of the following: the distance between neighboring dummy metals is about 50 micrometers, and the length of any edge of any dummy metal is about 150 micrometers. Also, the shape of each dummy metal may be quadrilateral, rectangle or square.

Furthermore, the usage of the dummy metals 16 have another advantage that the damages induced by the propagation of the electromagnetic wave form the back surface of the substrate 11 directly through the interior and/or the surface of the substrate 11 to the circuits 12 on the front surface may be reduced, such as the error messages and the extra noises. Note that the electromagnetic to be received and/or transmitted (especially to be received) not only appears in the space close to partial back surface occupied by the antenna 13 but also may appear in the space close to another partial back surface not occupied by the antenna 13. Hence, even the shared ground 13 and/or the dielectric material capable of electrically insulating the circuit 12 with the outside environment is utilized, the circuits 12 still may be affected by the electromagnetic wave because the practice may not fully achieve the electrical insulation. For example, if the area of the circuit 12 is larger than the area of the antenna 11 and the back surface of the substrate 11 directly faces the propagation direction of the electromagnetic wave, it may be simply viewed as only a portion of the circuit 11 being screened by the antenna 12, and then another portion of the circuit 11 may be easily affected by the electromagnetic wave directly propagated from the back surface of the substrate 11 through the substrate 11 to the circuit 12. Nevertheless, if the dummy metal 16 is positioned on the back surface of the substrate and surrounds the antenna 13, due to the effect of the shielding effect provided by the electric conductor such as metal, both the probability and the corresponding side effect of the propagation of the electromagnetic wave from partial back surface not occupied by the antenna 13 directly through the substrate 11 to the circuits 12 on the front surface may be reduce, and then further improve the performance of the proposed invention that position both the circuits 12 and the antenna 13 on different surface of the same substrate 11. It should be emphasized that the invention still does not limit the details of the dummy metals 16 on the back surface of the substrate 11, such as the number, the shape and the position, and all of the details may be adjusted according to the practical requirements, such as the relative configuration of the circuits 12, the antenna 13 and the shared ground 14.

Figure 3A:
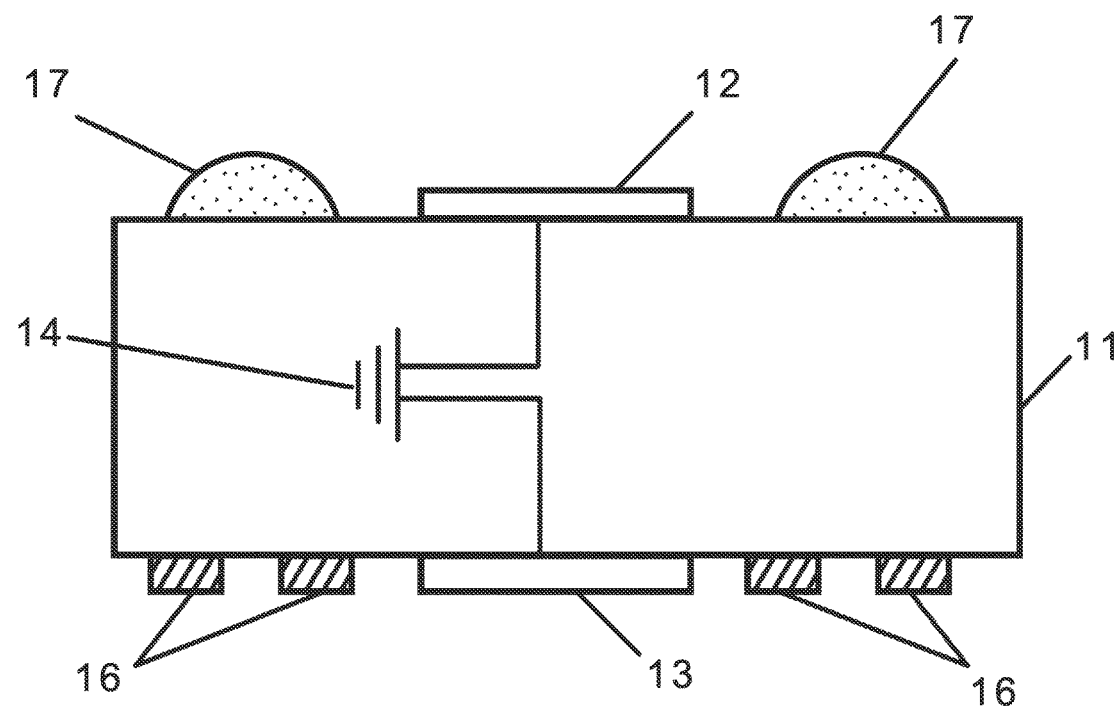
FIG. 3A to FIG. 3B briefly and respectively illustrates two exemplary configurations of the die with both circuits and antenna and using the ground ball.
Figure 3B:
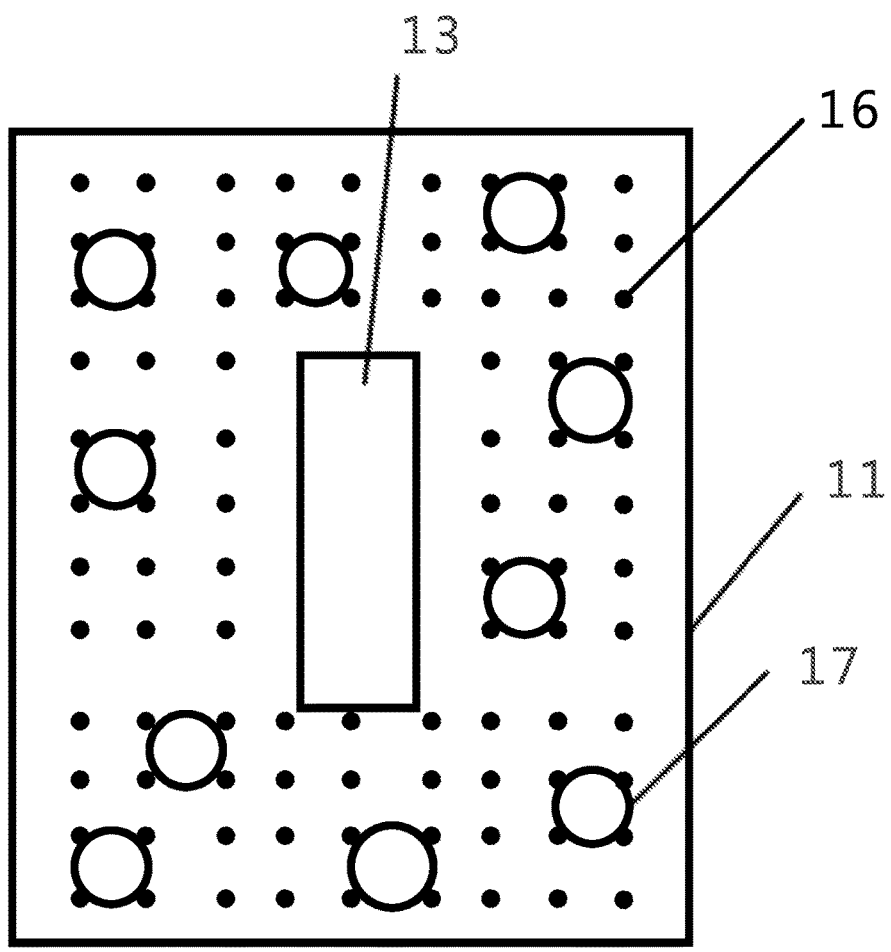

Furthermore, the induced current appears during the period of receiving and/or transmitting electromagnetic wave by the antenna 13 may be not ineligible and then some disadvantages may be generated correspondingly, such as the dummy metals being damaged by discharging and the operation of the circuits 12 and/or the antenna 13 may be degraded. Therefore, some embodiments of the proposed invention position have one or more ground balls for conducting the induced appeared on one or more surface (no matter the front surface, the back surface or the side surface) away the die with the integration of the circuits and the antenna, such as conducting the induced current to the printed circuit board that the die having the circuits and the antenna is positioned. Further, different ground balls are connected to different portions of one or more surface of the die. On different embodiments, these ground balls may uniformly distribute on the front surface of the substrate 11, or may uniformly distributes on the back surface of the substrate 11, or may distributes on the front surface of the substrate 11, or may distributes on the back surface of the substrate 11, or may distribute on one or more side surfaces of the substrate of substrate 11, and or may distribute on a portion of the substrate where the induced current density is higher if the antenna 13 transmits and/or receive the electromagnetic wave. Also, the distribution of the ground balls may enhance the mechanical strength of the die with the integration of the antenna and the circuits. The invention does not need to limit the details of the ground balls, such as the number, the shape and the distribution. For example, the ground balls may be gold bumps, solder balls or may be made of other conductive material(s). Two exemplary configurations of the die with both circuits and antenna and using the ground ball are briefly and respectively illustrated in FIG. 3A to FIG. 3B.

Figure 4A:
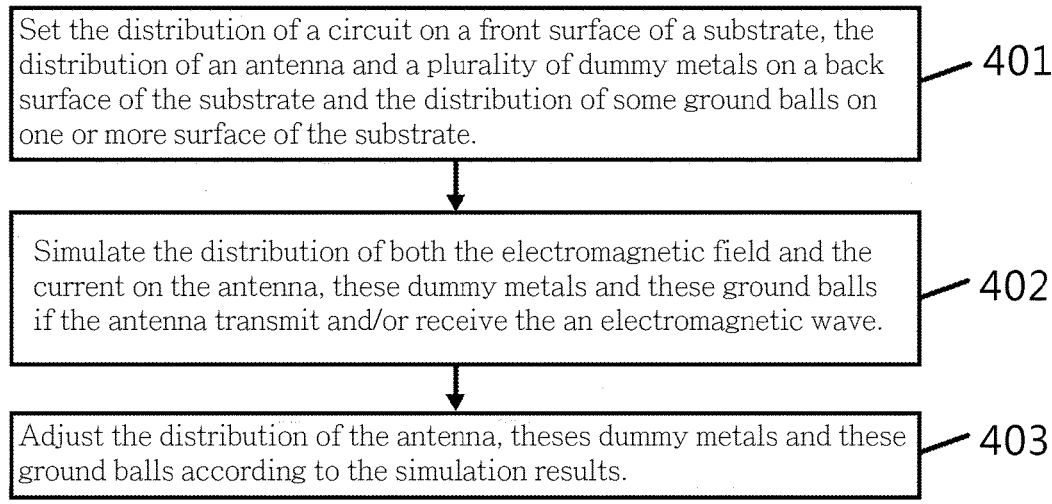
FIG. 4A to FIG. 4B respectively illustrates the essential flowchart of the proposed method of integrating the circuits and the antenna on the same die.
Figure 4B:
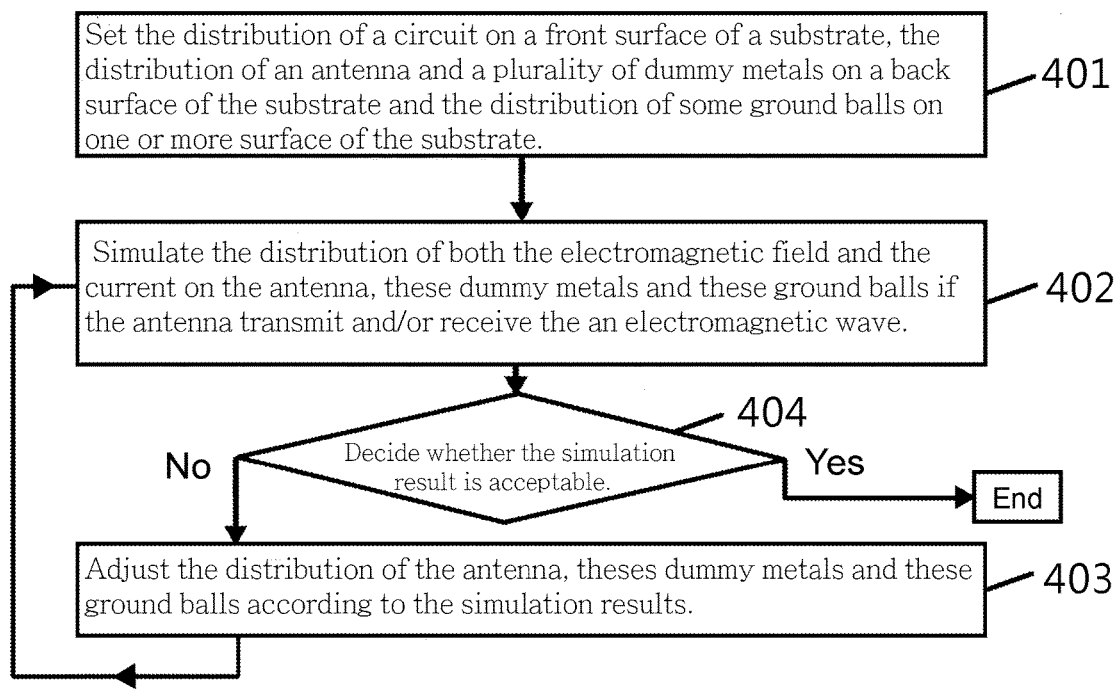

FIG. 4A to FIG. 4B respectively illustrates the essential flowchart of the proposed method of integrating the circuits and the antenna on the same die. Initially, as the step a shown in step block 401, set the distribution of a circuit on a front surface of a substrate, the distribution of an antenna and a plurality of dummy metals on a back surface of the substrate and the distribution of some ground balls on one or more surface of the substrate. It may be set according to the configurations of the similar dies stored in the database, or may be set by positioning the circuits and the antenna on the front surface and the back surface respectively and then randomly distribute these dummy metals and these ground balls, and also may set according to the above descriptions. The invention does not need to strictly limit how these distribution are set in the step a because the following steps will amend and adjust them. Next, as the step b shown in step block 402, simulate the distribution of both the electromagnetic field and the current on the antenna, these dummy metals and these ground balls if the antenna transmit and/or receive the an electromagnetic wave. The simulation has to particularly calculate the electromagnetic field and the current appeared on these ground balls and these dummy metals, especially has to calculate the distribution of the induced current. Then, as the step c shown in step block 403, adjust the distribution of the antenna, theses dummy metals and these ground balls according to the simulation results. The adjustment essentially adjusts the distribution of these dummy metals and these ground balls to the positions may effectively conduct the induced current away the die (or viewed as to the positions where the amplitude of the induced current is larger). After that, repeating step b and step c until the distribution of the electromagnetic field and the current on the antenna, these dummy metals and these ground balls meets the requirements. In other words, after step block 402, the decision block 404 is processed to decide whether the simulation result is acceptable, such as whether the calculated distribution or the effect of the induced current is in the acceptable range. If acceptable, directly utilize the simulation result generated in the step block 402 to be the practical configuration for fabricating the die with the integration of the antenna and the circuits. If unacceptable, process the step block 403 and the step 402 in sequence again, and then utilize the new simulation result to process the decision step 404 again. Again, the new simulation result of the decision step 404 is used to decide whether it may be utilized as the practical configuration or whether both the step block 403 and the step block 402 have to be process one more time. Such processes have to be processed until an acceptable result is found or may be stopped before finding the acceptable result. In the method, both the circuits and the antenna are electrically connected to the shared ground, these dummy metals surrounds and separated from the antenna, and different ground balls are connected to different portions of one or more surface of the substrate respectively. Further, in the step block c, the made adjustment must let the distribution of the dummy metals (such as the density of the dummy metals) meet the requirements of the mechanical strength and the fabrication process.

Further, the adjustments of the antenna are related to more factors, because the configuration of the antenna is related to both the wavelength and the amplitude of the electromagnetic wave designed to be received and/or transmitted by the antenna, also because the configuration of the antenna is related to how the electromagnetic signals are transmitted between the antenna and the circuits. In some embodiments, in the step b and the step c, the antenna is fixed but only both these dummy metals and these ground balls are repeatedly adjusted until the requirement being met. Moreover, the adjustments of the ground balls affect more than the distribution of the induced current, because the configuration of these ground balls is related to the connection between the printed circuit ball and the die with the integration of the antenna and the circuits. In some embodiments, in the step b and the step c, both the antenna and these ground balls are fixed but only these dummy metals are repeatedly adjusted unit the requirement being met. In additional, whether to adjust these ground balls and the antenna is decided by the practical situations and selectable, the invention does not need to limit.

In general, in the step c, the adjustable portions include but not limited by the following parameters: the size of at least one dummy metal, the shape of at least one dummy metal, the distance between at least two neighboring dummy metals, the distance between the antenna and at least one dummy metal, the positions of a portion of these dummy metals close to and surrounding the antenna, and both the number of the positions of these dummy metals. Also, in the step c, the adjustments include but not limited by the following actions: minimizing the size of these dummy metals, minimizing the distance between neighboring dummy metals, arranging the size of a portion of dummy metals positioned far way the antenna to be larger and the size of another portion of dummy metals positioned close to the antenna to be smaller, and maximizing the distance between these dummy metals and the two terminals of the antenna where the electromagnetic wave is transmitted and/or received but is closer to the antenna around other portions of the antenna. In general, in the step c, the adjustments include but not limited by the following actions: arranging the antenna to be positioned in the center of the back surface, arranging the antenna to be positioned around the antenna, arranging the antenna to be overlapped with the circuits along the direction vertical to the front surface and the back surface, arranging the antenna to be separated from the circuits along the direction vertical to the front surface and the back surface, arranging the size of the antenna to be proportional to the wavelength of the electromagnetic wave that the antenna is designed to transmitted and/or received, and arranging the antenna to occupy a large portion of the back surface if the antenna is a resonant antenna.

The key features of the invention may be briefly described as below: initially find the positions where the induce current is higher or the electromagnetic field is stronger by simulation, and then adjust the number, the distribution, the positions or the shapes or others of the dummy metals (even the ground balls and/or the antenna) so as to eliminate the generation of the induced current or to conduct the danger induced current away. Hence, the method may produce the die with the integration of the antenna and the circuits by directly utilizing the details and the variations of the die with the integration of the antenna and the circuits described above.

For example, the method does not need to limit the details of the circuits and the antenna. For example, the method may arrange the antenna to be positioned in the center of the back surface, or may arrange the antenna to be positioned on the edge of the back surface, or may arrange the antenna to be overlapped with the circuits along the direction vertical to the front surface and the back surface, also may arrange the antenna to be separated from the circuits along the direction vertical to the front surface and the back surface. For example, the method may design the size of the antenna to be proportional to the wavelength of the electromagnetic wave to be received and/or transmitted by the antenna, also may let the antenna occupy a larger portion of the back surface if the antenna is a resonant antenna. For example, the method may utilize the ground utilized by the circuits no matter whether the antenna is existed or not to be the shared ground, or may position the shard ground inside the substrate and between the antenna and the circuits, or may position the shared ground on the front surface, or may position the shared ground on the side surface of the substrate, or may position the shared ground inside the substrate. For example, the method may arrange the area ratio between the antenna and these dummy metals on the back surface and the distribution of both the antenna and these dummy metals according to both the mechanical strength of the die and the fabrication process of the die.

For example, the method may arrange these dummy metals to be are more far away to the antenna around the two terminals of the antenna where the electromagnetic wave is transmitted and/or received but to be closer to the antenna around other portions of the antenna, or may arrange the density of these dummy metals to be lower around the two terminals of the antenna where the electromagnetic wave is transmitted and/or received but to be higher close to other portions of the antenna, or may arrange the size of each dummy metals to be smaller around the two terminals of the antenna where the electromagnetic wave is transmitted and/or received but to be larger close to other portions of the antenna, or may arrange the density of partial dummy metals to be lower if they are far away the antenna and the density of another partial dummy metals to be higher if they are close to the antenna, or may arrange the size of partial dummy metals to be smaller if they are far away the antenna and the size of another partial dummy metals to be larger if they are close to the antenna.

For example, the method may uniformly distribute these ground balls on the front surface of the substrate, or may uniformly distribute these ground balls on the back surface of the substrate, or may distribute these ground balls on the front surface of the substrate, or may distribute these ground balls on the back surface of the substrate, or may distribute these ground balls on one or more surfaces of the substrate (no matter the front surface, the back surface or the side surfaces), or may position these ground balls on where the induced current is denser or stronger as the antenna receives and/or transmits the electromagnetic wave. In addition, the invention does not need to limit the details of these ground balls, for example the gold bumps or the solder balls may be utilized to form these ground balls.

For example, if the antenna is designed to transmit and/or receive the electromagnetic wave with the frequency range between 80 GHz to 650 GHz, i.e., the antenna is designed to process is recently developed THz waves, the simulation and the adjustment in the step b and the step c may include at least one of the following: the distance between neighboring dummy metals is about 50 micrometers, the length of any edge of any dummy metal is about 150 micrometers, the shape of any dummy metal is quadrilateral, and the shape of any dummy metal is rectangle.

Incidentally, the advantages of both the proposed die with the integration of the antenna and the circuits and the corresponding method will be significantly appeared if the frequency of the electromagnetic wave to be received and/or transmitted is larger than about 60 GHz. For example, the length of the antenna is about 417.6 micrometers if the material of the substrate is Gallium Arsenide with the dielectric coefficient about 12.9 and if the antenna is designed to receive and/or transmit the electromagnetic wave with the frequency about 100 GHZ (the wavelength is about 3000 micrometers). Note that the antenna size and the wavelength are on the same order. Further, in the general commercial applications, the edge of the die is about 2 millimeter and the size of the antenna is briefly one-third to one-second of the die size (considering the mechanical strength, the heat dissipation, the electromagnetic interference and the following package process). Simply, the advantages of the proposed die with the integration of the antenna and the circuits and the proposed method will be significantly appeared if the frequency of the electromagnetic wave is higher than about 60 GHz or even higher more.

The presently disclosed embodiments should be considered in all respects to be illustrative and not restrictive. The scope of the invention is indicated by the appended claims rather than the foregoing description, and all variation which come within the meaning and range of equivalents thereof are intended to be embraced therein.

What is claimed is:

1. A die with the integration of a circuit and an antenna, comprising:
    a substrate, the substrate has a front surface and a back surface;
    a circuit, the circuit is positioned on the front surface of the substrate;
    an antenna, the antenna is positioned on the back surface of the substrate;
    a shared ground, the shared ground is electrically connected to the circuit and the antenna; and
    a plurality of dummy metals positioned on the back surface, wherein these dummy metals surround the antenna but are separated from the antenna.

2. The die as claimed in claim 1, further comprising at least one of the following:
    the shared ground is positioned on the front surface;
    the shared ground is positioned on the side surface of the substrate;
    the shared ground is positioned inside the substrate; and
    the shared ground is positioned inside the substrate and between the antenna and the circuits.

3. The die as claimed in claim 1, wherein the shared ground is the ground utilized by the circuit no matter whether the antenna is existed or not.

4. The die as claimed in claim 1, wherein the position of the antenna on the backside is adjustable, and wherein the antenna is not limited to be positioned in the center of the back surface also is not limited to be overlapped with the circuit along a direction vertical to the front surface and the back surface.

5. The die as claimed in claim 1, wherein the size of the antenna is proportion to the wavelength of the electromagnetic wave that the antenna is designed to receive and transmit.

6. The die as claimed in claim 1, wherein the ratio between the area of the antenna and the area of the back surface is as large as possible if the antenna is a resonant antenna and is less limited if the antenna is a non-resonant antenna.

7. The die as claimed in claim 1, wherein both the area ratio between the antenna and these dummy metals and the distribution of both the dummy metals and the antenna on the back surface are decided by at least the mechanical strength of the die and the fabrication process of the die.

8. The die as claimed in claim 1, the distribution of these dummy metals on the back surface being limited by at least one of the following:
    these dummy metals are more far away to the antenna around the two terminals of the antenna where the electromagnetic wave is transmitted and/or received but is closer to the antenna around other portions of the antenna;
    the density of these dummy metals is lower around the two terminals of the antenna where the electromagnetic wave is transmitted and/or received but is higher close to other portions of the antenna; and
    the size of each dummy metals is smaller around the two terminals of the antenna where the electromagnetic wave is transmitted and/or received but is larger close to other portions of the antenna.

9. The die as claimed in claim 1, the distribution of these dummy metals on the back surface being limited by at least one of the following:
    the density of partial dummy metals is lower if they are far away from the antenna and the density of another partial dummy metals is higher if they are close to the antenna; and the size of partial dummy metals is smaller if they are far away from the antenna and the size of another partial dummy metals is larger if they are close to the antenna.

10. The die as claimed in claim 1, the distribution of these dummy metals on the back surface being limited by at least one of the following:
the distance between these dummy metals and the antenna is proportional to the wavelength of the electromagnetic wave the antenna being designed to transmit and/or receive;
the distance between these dummy metals and the two terminals of the antenna where the electromagnetic wave is transmitted and/or received is proportional to the wavelength of the electromagnetic wave the antenna being designed to transmit and/or receive; and
the distance between neighboring dummy metals is proportional to the wavelength of the electromagnetic wave the antenna being designed to transmit and/or receive.

11. The die as claimed in claim 1, the distribution of these dummy metals on the back surface is limited by at least one of the following if the antenna is designed to transmit and/or receive the electromagnetic wave with the frequency range between 80 GHz to 650 GHz:
the distance between neighboring dummy metals is about 50 micrometers;
the length of any edge of any dummy metal is about 150 micro meters; and
the shape of any dummy metal is quadrilateral or rectangle.

12. The die as claimed in claim 1, further comprising one or more ground balls which are connected to different portions of these dummy metals respectively.

13. The die as claimed in claim 12, further comprising at least one of the following:
these ground balls uniformly distribute on the front surface;
these ground balls uniformly distributes on the back surface;
these ground balls distributes on the front surface;
these ground balls distributes on the back surface;
these ground balls distributes on one or more side surfaces of the substrate; and
these ground balls distributes on a portion of the substrate where the induced current density is higher if the antenna transmits and/or receive the electromagnetic wave.

14. The die as claimed in claim 12, wherein these ground balls are gold bumps or solder balls.

15. A method of integrating a circuit and an antenna on a die, comprising:
a. setting the distribution of a circuit on a front surface of a substrate, the distribution of an antenna and a plurality of dummy metals on a back surface of the substrate and the distribution of a plurality of ground balls on one or more surface of the substrate;
b. simulating the distribution of both the electromagnetic field and the current on the antenna, these dummy metals and these ground balls if the antenna transmit and/or receive the an electromagnetic wave;
c. adjusting the distribution of the antenna, theses dummy metals and these ground balls according to the simulation results; and
d. repeating step b and step c until the distribution of the electromagnetic field and the current on the antenna, these dummy metals and these ground balls meets the requirements;
wherein the circuit and the antenna are electrically connected to a shared ground;
wherein these dummy metals surround the antenna and are separated away the antenna;
wherein different ground balls connect to different portions of one or more surfaces of the substrate respectively.

16. The method as claimed in claim 15, further comprising fixing the antenna but only repeatedly adjusting both these dummy metals and these ground balls until meeting the requirement in the step b and the step c.

17. The method as claimed in claim 15, further comprising fixing both the antenna and these ground balls but only repeatedly adjusting these dummy metals unit meeting the requirement in the step b and the step c.

18. The method as claimed in claim 15, further comprising adjusting at least one of the following in the step c: the size of at least one dummy metal, the shape of at least one dummy metal, the distance between at least two neighboring dummy metals, the distance between the antenna and at least one dummy metal, the positions of a portion of these dummy metals close to and surrounding the antenna, and both the number of the positions of these dummy metals.

19. The method as claimed in claim 15, further comprising at least one of the following in the step c: minimizing the size of these dummy metals, minimizing the distance between neighboring dummy metals, arranging the size of a portion of dummy metals positioned far way the antenna to be larger and the size of another portion of dummy metals positioned close to the antenna to be smaller, and maximizing the distance between these dummy metals and the two terminals of the antenna where the electromagnetic wave is transmitted and/or received but is closer to the antenna around other portions of the antenna.

20. The method as claimed in claim 15, further comprising at least one of the following:
arranging the antenna to be positioned in the center of the back surface;
arranging the antenna to be positioned around the antenna;
arranging the antenna to be overlapped with the circuit along the direction vertical to the front surface and the back surface;
arranging the antenna to be separated from the circuits along the direction vertical to the front surface and the back surface;
arranging the size of the antenna to be proportional to the wavelength of the electromagnetic wave that the antenna is designed to transmit and/or receive; and
arranging the antenna to occupy a large portion of the back surface if the antenna is a resonant antenna.

21. The method as claimed in claim 15, further comprising at least one of the following:
utilizing the ground utilized by the circuit no matter whether the antenna is existed or not to be the shared ground;
positioning the shard ground inside the substrate and between the antenna and the circuits;
positioning the shared ground on the front surface;
positioning the shared ground on the side surface of the substrate; and
positioning the shared ground inside the substrate.

22. The method as claimed in claim 15, further comprising arranging the area ratio between the antenna and these dummy metals on the back surface and the distribution of both the antenna and these dummy metals according to both the mechanical strength of the die and the fabrication process of the die.

23. The method as claimed in claim 15, further comprising adjusting the distribution of these dummy metals on the back surface according at least one of the following:

these dummy metals are more far away from the antenna around the two terminals of the antenna where the electromagnetic wave is transmitted and/or received but is closer to the antenna around other portions of the antenna;

the density of these dummy metals is lower around the two terminals of the antenna where the electromagnetic wave is transmitted and/or received but is higher close to other portions of the antenna; and the size of each dummy metals is smaller around the two terminals of the antenna where the electromagnetic wave is transmitted and/or received but is larger close to other portions of the antenna.

24. The method as claimed in claim 15, further comprising adjusting the distribution of these dummy metals on the back surface according to at least one of the following:

the density of partial dummy metals is lower if they are far away from the antenna and the density of another partial dummy metals is higher if they are close to the antenna; and the size of partial dummy metals is smaller if they are far away from the antenna and the size of another partial dummy metals is larger if they are close to the antenna.

25. The method as claimed in claim 15, further comprising adjusting the distribution of these dummy metals on the back surface according to at least one of the following:

the distance between these dummy metals and the antenna is proportional to the wavelength of the electromagnetic wave the antenna being designed to transmit and/or receive;

the distance between these dummy metals and the two terminals of the antenna where the electromagnetic wave is transmitted and/or received is proportional to the wavelength of the electromagnetic wave the antenna being designed to transmit and/or receive; and the distance between neighboring dummy metals is proportional to the wavelength of the electromagnetic wave the antenna being designed to transmit and/or receive.

26. The method as claimed in claim 15, further comprising at least one of the following:

uniformly distributing these ground balls on the front surface;

uniformly distributing these ground balls on the back surface;

distributing these ground balls on the front surface;

distributing these ground balls on the back surface;

distributing these ground balls on one or more side surfaces of the substrate; and distributing these ground balls on a portion of the substrate where the induced current density is higher if the antenna transmits and/or receives the electromagnetic wave.

27. The method as claimed in claim 15, further comprising utilizing the gold bumps or the solder balls to form these ground balls.

28. The method as claimed in claim 15, further comprising at least one of the following in step b and step c if the antenna is designed to transmit and/or receive the electromagnetic wave with the frequency range between 80 GHz to 650 GHz:

the distance between neighboring dummy metals is about 50 micrometers;

the length of any edge of any dummy metal is about 150 micro meters; and the shape of any dummy metal is quadrilateral or rectangle.

* * * * *